(12) United States Patent
Wang et al.

(10) Patent No.: US 7,134,918 B2
(45) Date of Patent: Nov. 14, 2006

(54) ELECTRICAL CONNECTOR ASSEMBLY

(75) Inventors: Ning Wang, Kunsan (CN); Zhi-giang Chen, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/148,531

(22) Filed: Jun. 8, 2005

(65) Prior Publication Data

US 2006/0073714 A1    Apr. 6, 2006

(30) Foreign Application Priority Data

Oct. 5, 2004    (CN) ........................ 2004 2 0080061

(51) Int. Cl.
*H01R 13/64* (2006.01)
(52) U.S. Cl. ..................................... 439/677
(58) Field of Classification Search .................. 439/79, 439/80, 680, 677, 570.1
See application file for complete search history.

(56) References Cited

U.S. PATENT DOCUMENTS

| 5,129,831 | A | * | 7/1992 | Locati | ......................... | 439/79 |
| 5,147,226 | A | * | 9/1992 | Kile | ........................... | 439/680 |
| 5,989,040 | A | * | 11/1999 | Nishimatsu | .................. | 439/79 |
| 6,296,528 | B1 | | 10/2001 | Roberts et al. | | |
| 6,350,156 | B1 | | 2/2002 | Hasircoglu et al. | | |
| 6,511,350 | B1 | | 1/2003 | Ito et al. | | |

* cited by examiner

*Primary Examiner*—Phuong Dinh
(74) *Attorney, Agent, or Firm*—Wei Te Chung

(57) ABSTRACT

An electrical connector assembly comprises a first connector (1) and a second connector (1') having a same configuration with a housing (30, 30') and a mounting face (34, 34') adapted for mounting onto a printed circuit board PCB (100) except for a distinguishable portion (353, 353') provided on the housing (30, 30') adjacent to the mounting face (34, 34') thereof. The first connector (1) is not able to be regarded as the second connector (1') to be mounted onto the PCB (100) due to the different distinguishable portions (353, 353') of the first and second connectors (1,1').

20 Claims, 8 Drawing Sheets

ELECTRICAL CONNECTOR ASSEMBLY

BACKGROUND OF THE INVENTION

1. Field of the Invention

The present invention generally relates to an electrical connector assembly, and in particular to an electrical connector assembly having an erroneous installation prevention function to prevent each electrical connector from being mounted to an incorrect position.

2. Description of Related Art

Today there are different categories of electrical connectors, so it is possible to mount two or more categories of connectors on a printed circuit board, it is also possible to mount two or more connectors, which are of a category and have similar configuration, just different from functions on a printed circuit board. In condition of the latter, it is very difficult to mount the connectors to right positions by virtue of configuration, so a general method is to distinguish the connectors by their colors.

However, in pipelining, a factory worker repeats continuously the same action of mounting connectors on a printed circuit in a day, therefore, he is too tied to distinguish connectors by their colors, that is, mount a connector on a position, which is the right position for the other connector having similar configuration to the connector but different colors and functions from the connector. As a result, the connectors need remount on the printed circuit, sometimes, the connectors may be destroyed.

SUMMARY OF THE INVENTION

Accordingly, an objection of the present invention is to provide an electrical connector assembly having an erroneous installation prevention function to prevent each electrical connector from being mounted to an incorrect position.

In order to achieve the objection set forth, an electrical connector assembly in accordance with the present invention comprises a first connector and a second connector having a same configuration with a housing and a mounting face adapted for mounting onto a printed circuit board except for a distinguishable portion provided on the housing adjacent to the mounting face thereof.

Other objects, advantages and novel features of the present invention will become more apparent from the following detailed description of the present embodiment when taken in conjunction with the accompanying drawings.

DETAILED DESCRIPTION OF THE INVENTION

Figure 2:
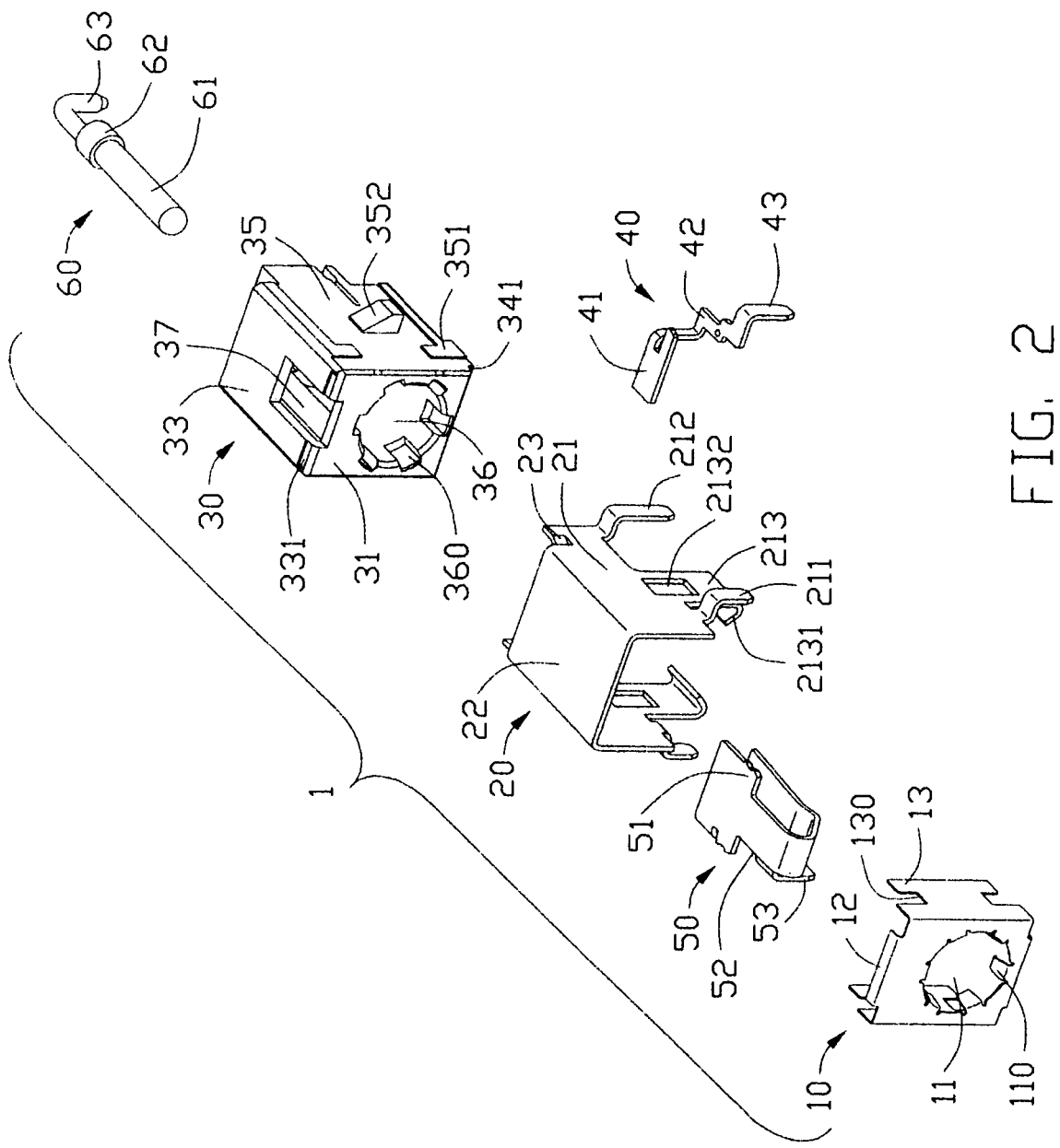
FIG. 2 is a perspective exploded view of the first connector as seen from the frontal side.

An electrical connector assembly in accordance with the present invention includes a first connector 1 and a second connector 1'. Referring to FIG. 2, the first connector 1 comprises a first shielding 10, a second shielding 20, a housing 30, a first grounding contact 40, a second grounding contact 50 and an electrical contact 60.

A hole 11 is defined in a center of the first shielding 10 and some pieces 110 are extending backwards from the edge of the hole 11. A top, bottom wing 12 and a left, right wing 13 are respectively extending backwards from the top, bottom and left, right side of the first shielding 10. Otherwise, a gap 130 is defined at top, bottom edge of the left, right wing 13.

The second shielding 20 has a pair of sides 21 and a top 22. The side 21 is formed with a first soldering portion 211, a securing portion 213 and a second soldering portion 212 in the sequence from the front to back thereof. A curved edge 2131 is provided at a free end of the securing portion 213 and curves entad. And the securing portion 213 is provided with an aperture 2132 in the center thereof. Furthermore, a recess 23 is defined at the back of the side 21 and close to the top 22.

Figure 1:
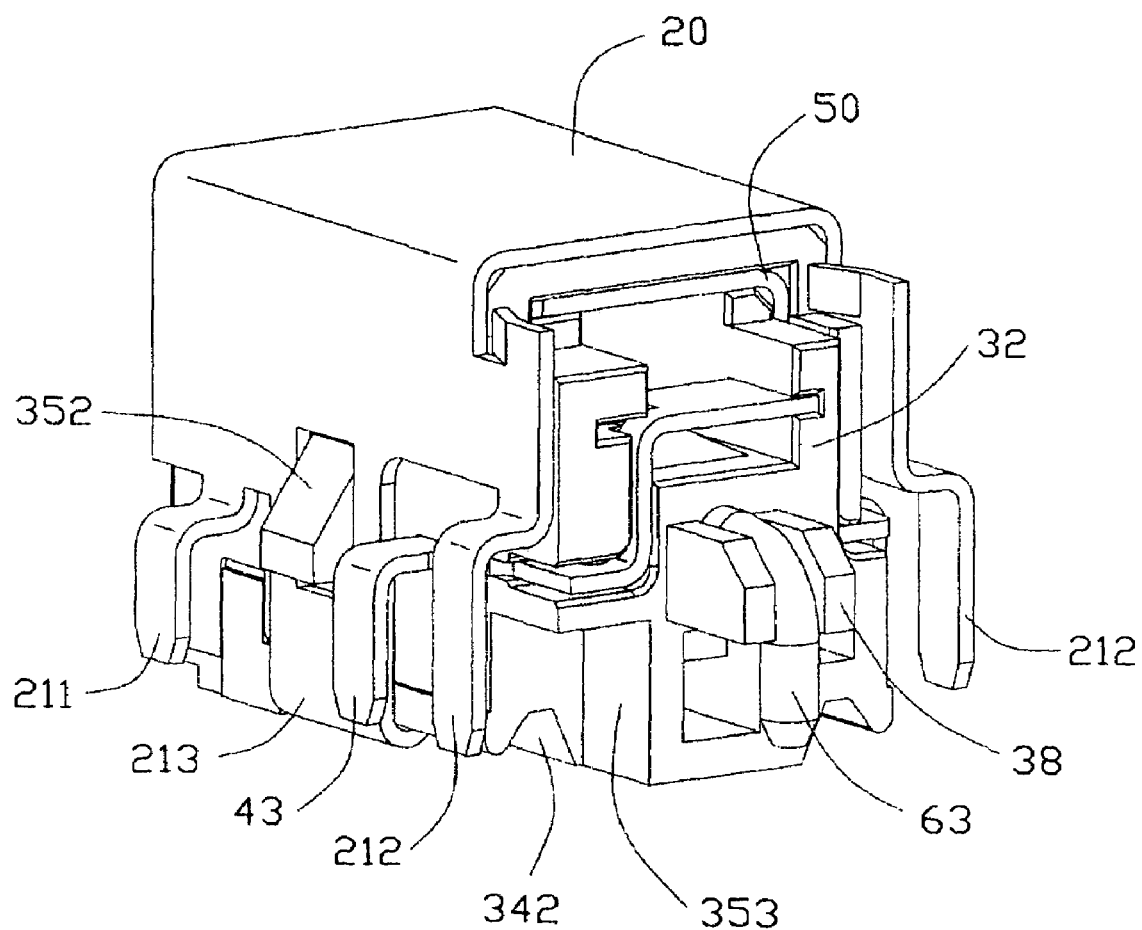
FIG. 1 is a perspective view of a first connector of an electrical connector assembly according to the invention as seen from the back side.
Figure 3:
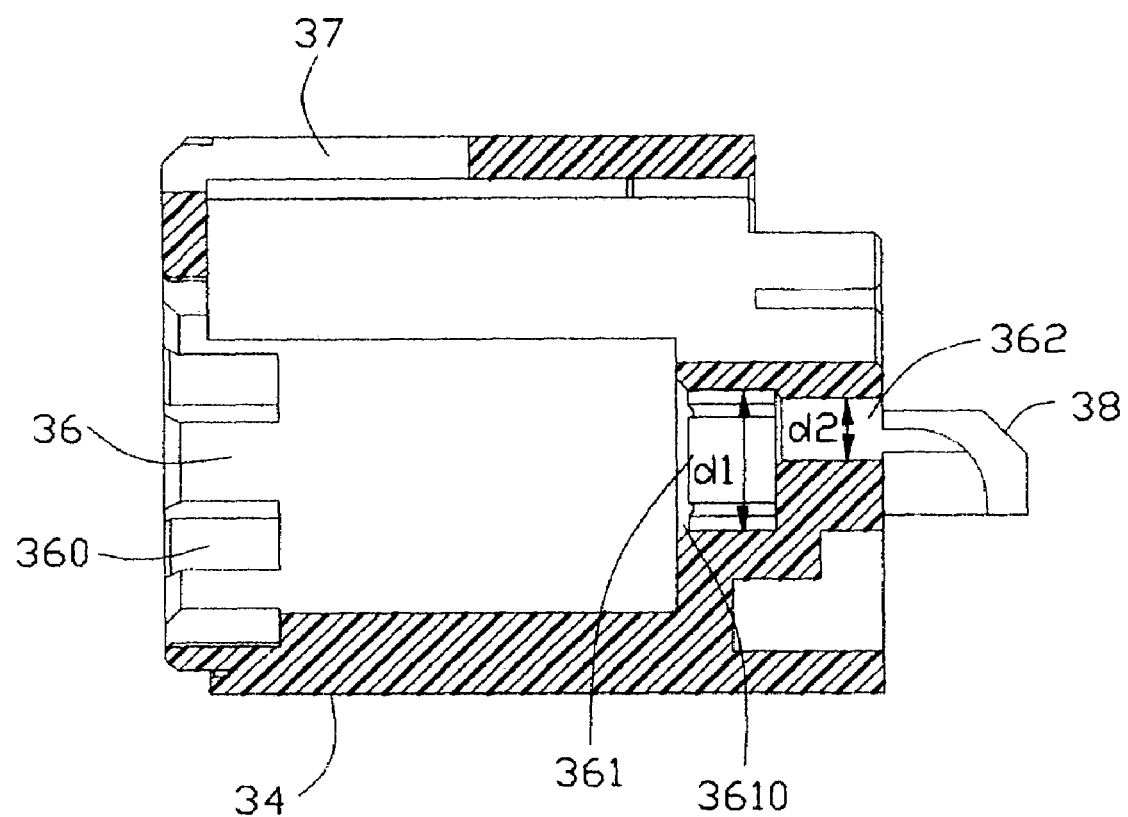
FIG. 3 is a cross-sectional view of the first connector.

The housing 30 has a frontal face 31, a rear face 32, a top face 33, a mounting face 34 and a pair of side faces 35 parallel to each other. The frontal face 31 is defined a receiving cavity 36 extending backwards and matching the hole 11 of the first shielding 10. The receiving cavity 36 is provided with some grooves 360 arranging at intervals and extending backwards from a perimeter thereof to match the pieces 110 of the hole 11. The top face 33 is defined an opening 37 communicating with the receiving cavity 36 for dispersing heat while transferring electric current. Combining with FIGS. 1 and 3, the rear face 32 is formed with a projection 38 and a receiving hole is defined from the receiving cavity 36 to the projection 38. The receiving hole includes a frontal hole 361 having a diameter of d1 and a rear hole 362 having a diameter of d2, bigger than d1, accordingly a step is formed between the frontal hole 361 and the rear hole 362. The receiving cavity 36, the frontal hole 361 and the rear hole 362 is of the same axis. Further, the rear hole 362 going vertically through the bottom of the projection 38 that forms a pair of arms extending vertically at the rear end of the projection 38. In addition, the frontal hole 361 is formed with a guiding portion 3610 at the frontal end thereof.

The top face 33 of the housing 30 is formed with a top step 331 at the frontal end thereof and the mounting face 34 is formed with a bottom step 341 at the frontal end thereof. The top step 331 and the bottom step 341 respectively match the top and bottom wing 12. The two opposite side faces 35 are provided with a pair of L-shaped protuberances 351 matching the left and right wings 13 of the first shielding 10 so as to secure the first shielding 10 on the housing 30. The second shielding 20 is secured on the housing 30 by the pair of curved edges 2131 matching a pair of slots 342 respectively defined on opposite sides of the mounting face 34 and the pair of apertures 2132 matching a pair of trapeziform projections 352 respectively formed at the centers of two opposite side faces 35 of the housing 30. A first recess 353 is defined at the corner which the right side face 35 (in the direction from the frontal face 31 to the rear face 32) joins the rear face 32.

The first grounding contact 40 has a base 41, a first curved portion 42, which are received in the housing 30, and a first soldering portion 43 protruding from the side face 35 of the housing 30.

The second grounding contact 50 has a U-shaped base 51, a second curved portion 52, which are received in the housing 30, and a second soldering portion 53 protruding from the opposite side face 35 of the housing 30.

The electrical contact 60 has a mating portion 61 mating with a mating connector (not shown), a fixing portion 62 and a connecting portion 63 connecting with a printed circuit board. At the embodiment, the mating portion 61, the fixing portion 62 and the connecting portion 63 is columned. The diameter of the fixing portion 62 equal to d1 is bigger than that of the mating portion 61. More, the diameter of the mating portion 61 is bigger than that of the connecting portion 63 equal to d2. Otherwise, the mating connector can be a power supply connector.

Figure 4:
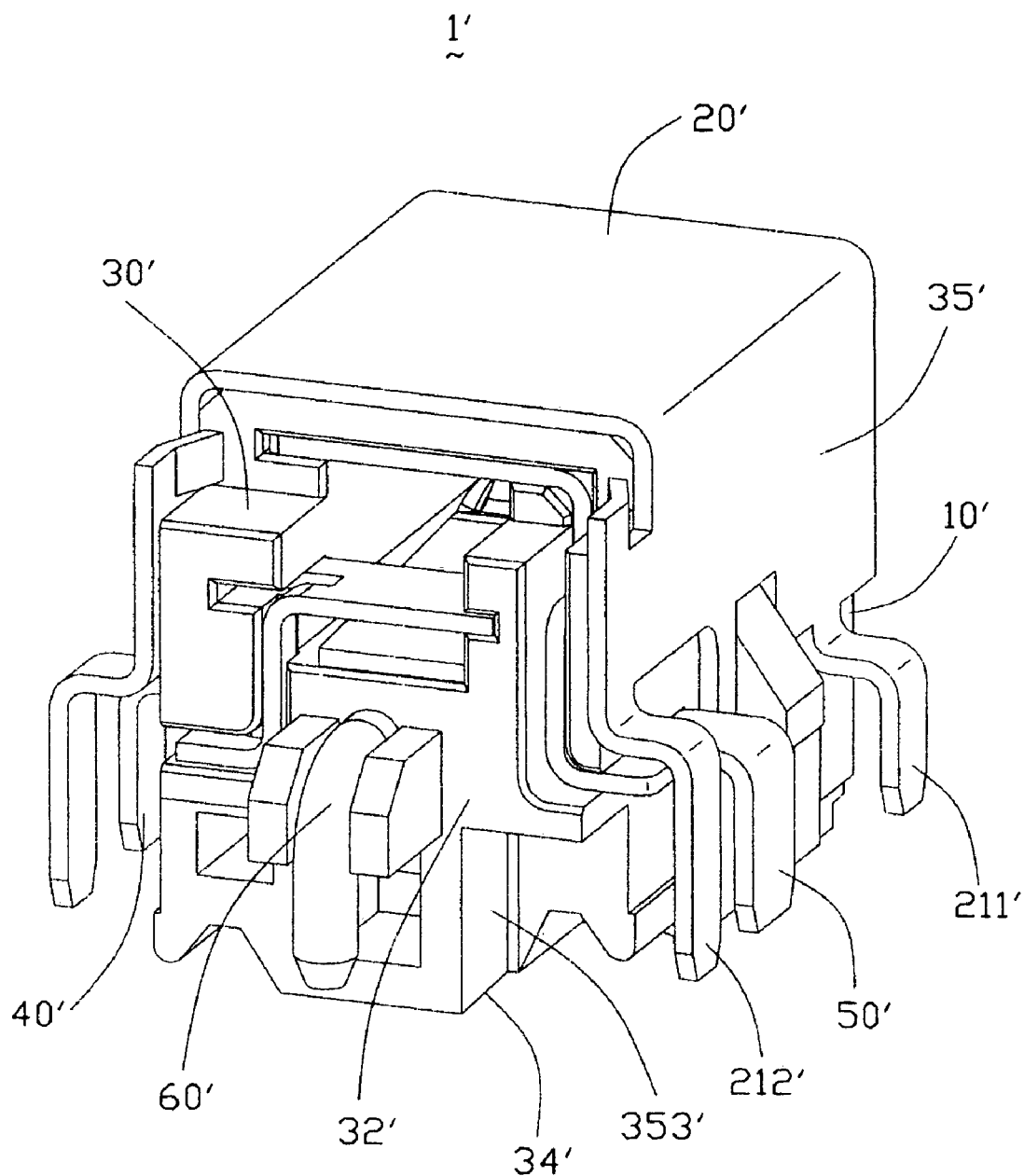
FIG. 4 is a perspective view of a second connector of the electrical connector assembly as seen from the back side.

At the embodiment, referring to FIG. 4, the second connector 1' corresponding to the first connector 1 comprises a first shielding 10', a second shielding 20', a first grounding contact 40', a second grounding contact 50' and an electrical contact 60', which have the same configurations with the first shielding 10, the second shielding 20, the first grounding contact 40, the second grounding contact 50 and the electrical contact 60 of the first connector 1. The second connector 1' also has a housing 30', which has the same configuration with the housing 30 of the first connector 1, with the exception that a second recess 353' is defined at the corner which the left side face 35' (in the direction from the frontal face 31' to the rear face 32') joins the rear face 32'.

Figure 5:
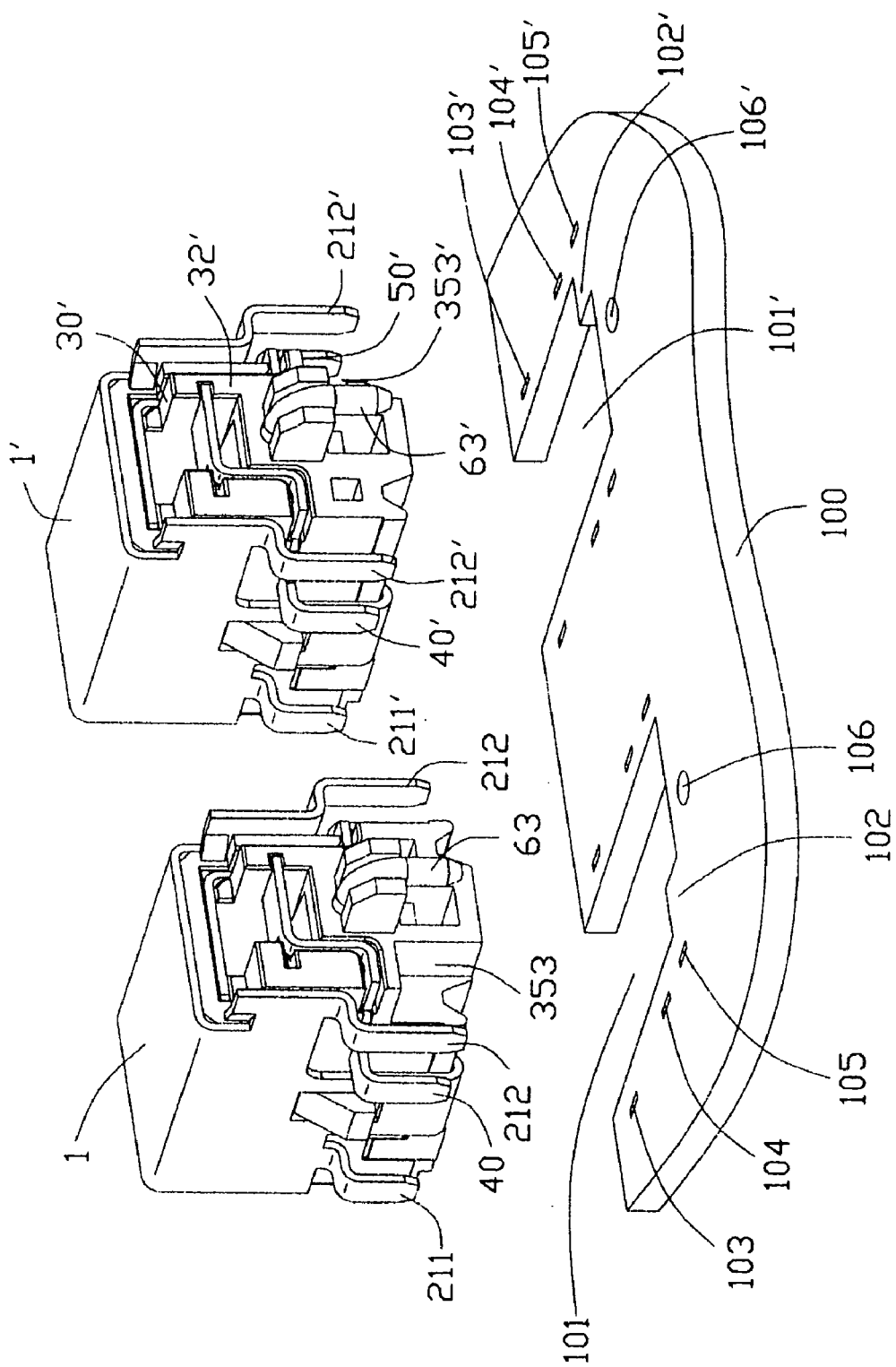
FIG. 5 is a perspective view of an electrical system comprising the electrical connector assembly and a printed circuit board as seen from the back side.
Figure 6:
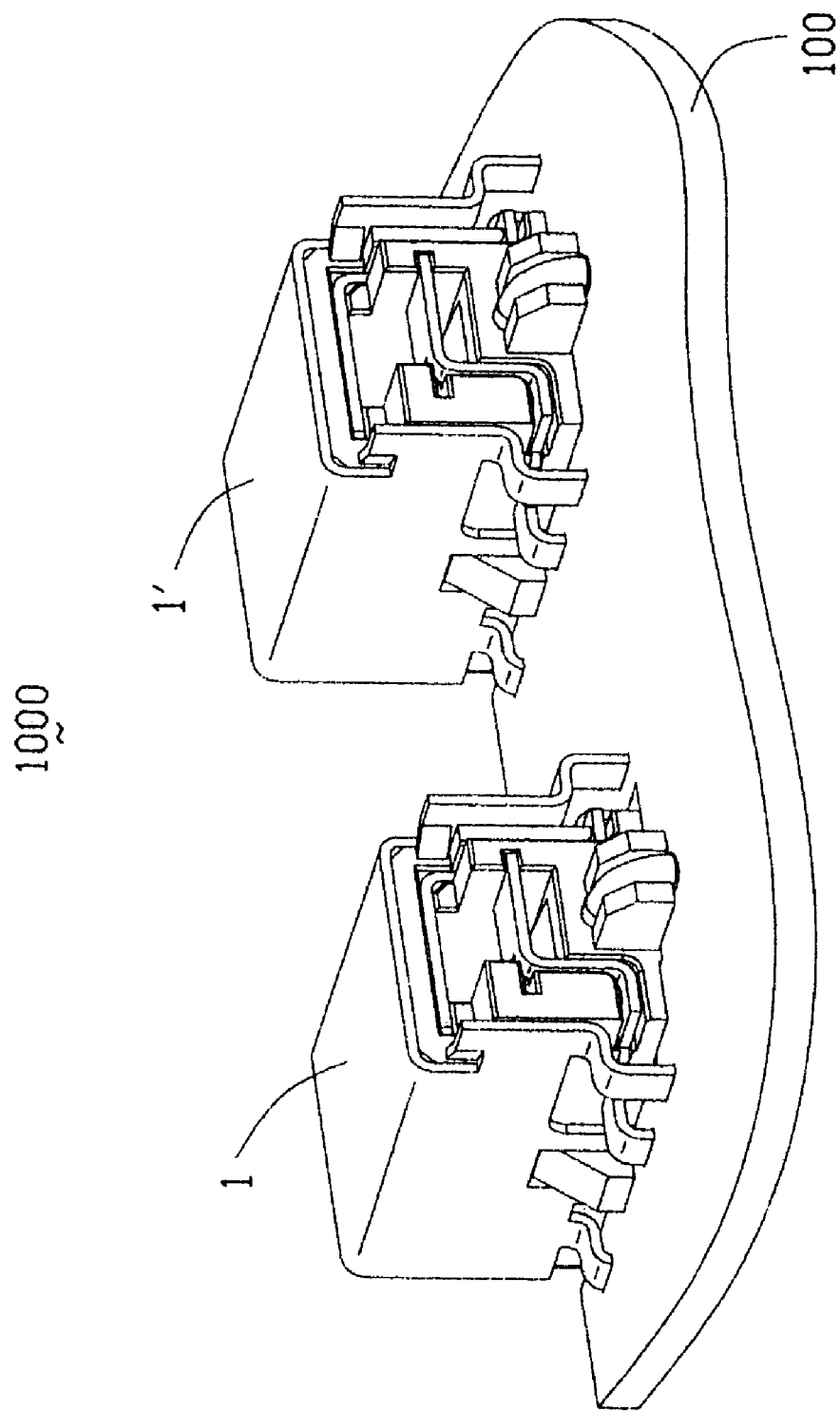
FIG. 6 is a perspective view of the electrical system showing the electrical connector assembly assembled to the printed circuit board as seen from the back side.
Figure 7:
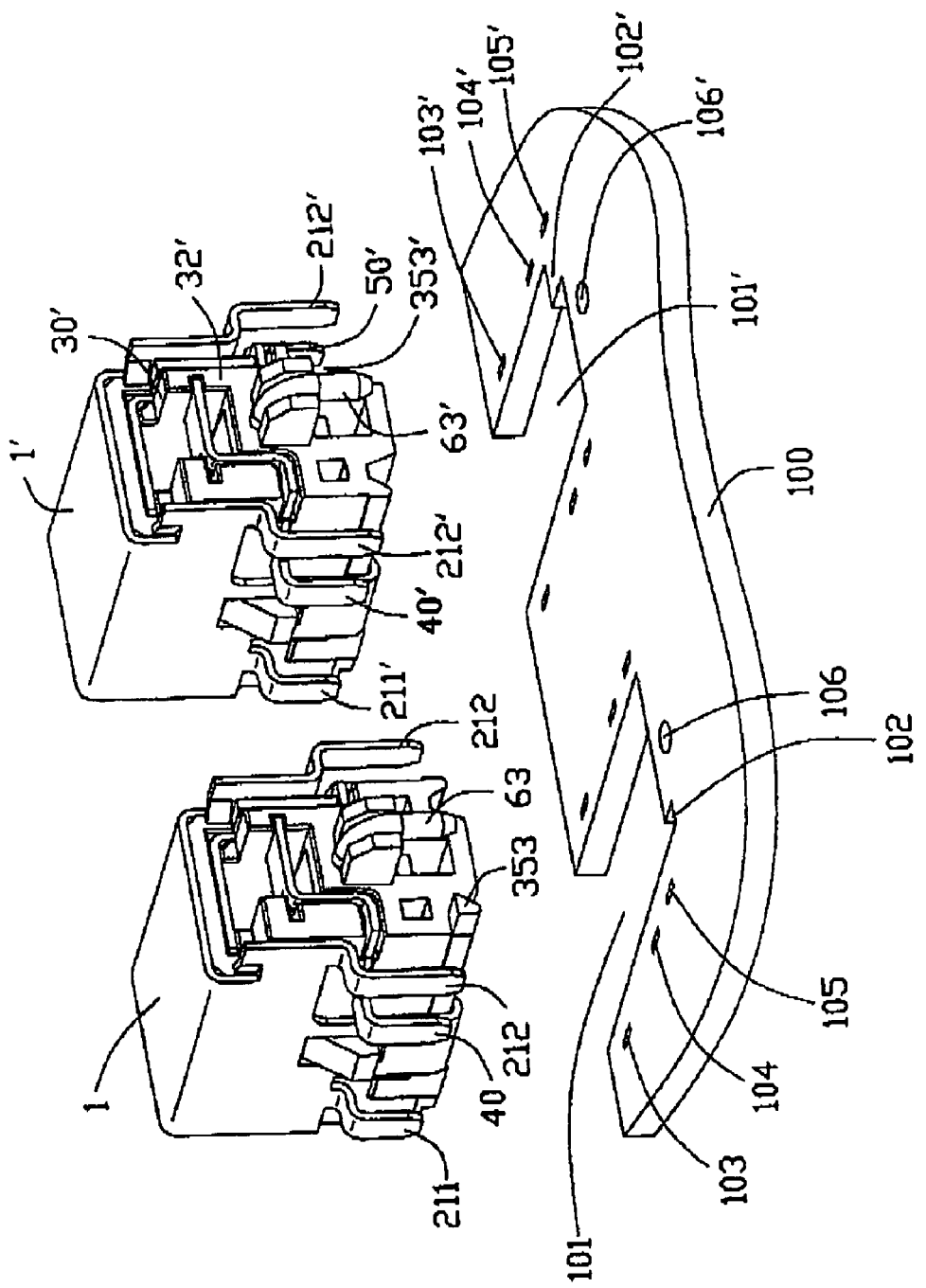
Figure 8:
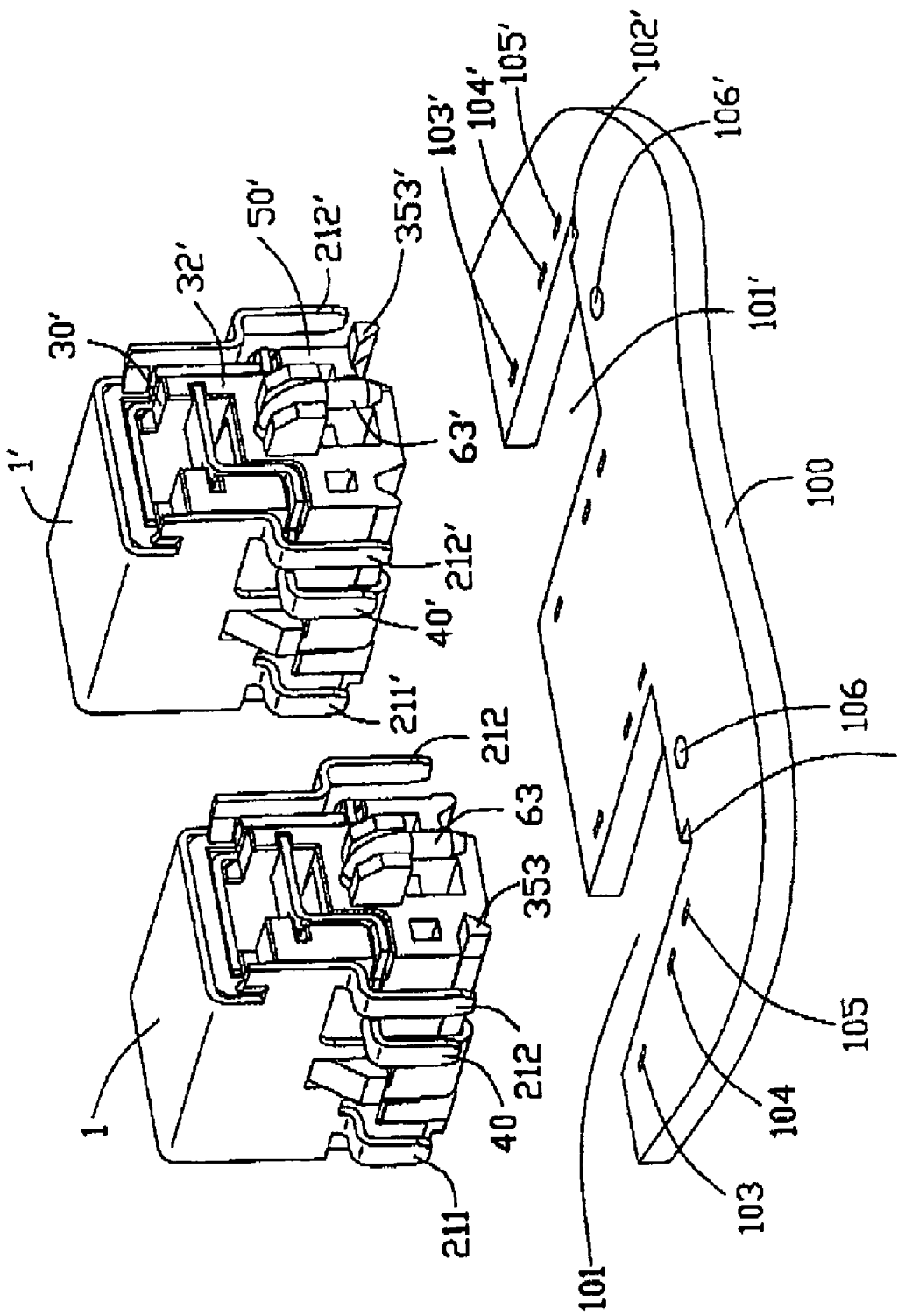

Referring to FIGS. 5 and 6, an electrical system 1000 is provided by assembling the first connector 1 and the second connector 1' to a printed circuit board (PCB) 100. Concretely, the first connector 1 and the second connector 1' are respectively assembled in a first cutout 101 and a second cutout 101' defined at a brim of the PCB 100. The first cutout 101 is provided with a protuberance 102 at the top right-hand corner thereof (in the direction from the first cutout 101 to the inside, that is from the front to the back thereof). The protuberance 102 is engageable with the first recess 353 of the first connector 1. The first soldering portion 211, the first soldering portion 43 and the second soldering portion 53, the second soldering portion 212 of the first connector 1 are respectively inserted in a series of first mounting holes 103, 104, 105 arranging in sequence from the front to the back of the first cutout 101 on the PCB 100. Otherwise, the connecting portion 63 of the electrical contact 60 of the first connector 1 is inserted in a first back mounting hole 106 defined at the back of the first cutout 101 on the PCB 100. On the other hand, the second cutout 101' is provided with a protuberance 102' at the top left-hand corner of (in the direction from the second cutout 101' to the inside, that is from the front to the back thereof). The protuberance 102' is engageable with the second recess 353' of the second connector 1'. The first soldering portion 211', the first soldering portion 43' and the second soldering portion 53', the second soldering portion 212' of the second connector 101' are respectively inserted in a series of second mounting holes 103', 104', 105' arranging in sequence from the front to the back of the second cutout 101' on the PCB 100. Otherwise, the connecting portion 63' of the electrical contact 60' of the second connector 1' is inserted in a second back mounting hole 106' defined at the back of the second cutout 101' on the PCB 100.

Therefore, if assembling the first connector 1 to the second cutout 101' of the PCB 100, the protuberance 102' resists the housing 30. Accordingly, if assembling the second connector 1' to the first cutout 101, the protuberance 102 resists the housing 30', so as to prevent from being mounted to an incorrect position.

A second embodiment is that the first recess 353 of the first connector 1 is substituted by a protuberance and correspondingly the protuberance 102 of the PCB 100 is substituted by a recess. A third embodiment is that the recess 353, 353' of the first and second connector 1, 1' are substituted by protuberances and correspondingly the protuberances 102, 102' are substituted by recesses. Where the key is that the distinguishable portions on the first and second connectors 1,1' have different positions or different sizes.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:
   a first connector having a housing, a mounting face adapted for mounting onto a printed circuit board (PCB) and a distinguishable portion unitary with the housing adjacent to the mounting face thereof; and
   a second connector having a housing, a mounting face adapted for mounting onto the PCB and a distinguishable portion different from that of the first connector on the housing adjacent to the mounting face thereof; wherein
   the first and second connector having a same configuration except for the distinguishable portions thereof, the first connector not able to be regarded as the second connector to be mounted onto the PCB due to the different distinguishable portions of the first and wherein the printed circuit board having at least a pair of mounting areas each having an anti-mismounting portions thereabout.

2. The electrical connector assembly as described in claim 1, wherein the distinguishable portions on the first and second connectors have different shapes.

3. The electrical connector assembly as described in claim 2, wherein the distinguishable portion on the first connector is a recess while the distinguishable portion on the second connector is a protuberance.

4. The electrical connector assembly as described in claim 2, wherein the distinguishable portion on the first connector is a protuberance while the distinguishable on the second connector is a recess.

5. The electrical connector assembly as described in claim 1, wherein the distinguishable portions on the first and the second connectors have different positions.

6. The electrical connector assembly as described in claim 5, wherein the distinguishable portion on the first connector is formed at a right-hand corner thereof, while the distinguishable portion on the second connector is formed at a left-hand corner thereof.

7. The electrical connector assembly as described in claim 6, wherein the distinguishable portion on the first connector is formed as a first recess and at a corner which a right side face joins a rear face of a housing thereof, while the distinguishable portion on the second connector is formed as a second recess and at a corner which a left side face joins a rear face of a housing thereof.

8. The electrical connector assembly as described in claim 6, wherein the distinguishable portion on the first connector is formed as a first protuberance and at a corner which a right side face joins a rear face of a housing thereof, while the distinguishable portion on the second connector is formed as a second protuberance and at a corner which a left side face joins a rear face of a housing thereof.

9. An electrical system, comprising:
a printed circuit board (PCB) having at least a pair of mounting areas each having an anti-mismounting portion at a brim thereof; and
at least a pair of electrical connectors having a same configuration except for distinguishable portions provided on housing adjacent to mounting faces thereof, the electrical connectors being not able to be incorrectly mounted onto corresponding mounting areas of the PCB by the distinguishable portions thereof cooperating with the anti-mismounting portions of the PCB; and
the housing defining a receiving cavity having a circular cross-section.

10. The electrical system as described in claim 9, wherein the anti-mismounting portions on the PCB have different shapes.

11. The electrical system as described in claim 10, wherein the anti-mismounting portion is a recess while the other is a protuberance.

12. The electrical system as described in claim 9, wherein the anti-mismounting portions on the PCB have different positions.

13. The electrical system as described in claim 12, wherein the anti-mismounting portion is formed at a right-hand corner of the mounting area on the PCB, while the other is formed at a left-hand corner thereof.

14. An electrical system, comprising:
a printed circuit board (PCB) having at least a pair of mounting areas each having an anti-mismounting portion thereabouts; and
at least a pair of electrical connectors having a same configuration including a same mating port except distinguishable portions provided thereon adjacent to mounting faces thereof, the electrical connectors being not able to be incorrectly mounted onto the corresponding mounting areas of the PCB by the distinguishable portions thereof cooperating with the anti-mismounting portions of the PCB; and
the mounting faces being not above an upper face of the PCB.

15. The system as claimed in claim 14, wherein the anti-mismounting portions are projections extending along a horizontal plane defined by the printed circuit board, and the distinguishable portions are recesses in the corresponding connectors.

16. The system as claimed in claim 14, wherein said distinguishable portions are provided by housings of the respective connectors.

17. The system as claimed in claim 14, wherein each of said connectors includes an insulative housing with contacts therein, and a metallic shielding enclosing said housing.

18. The system as claimed in claim 14, wherein said two mounting areas define two cutouts along an edge of the printed circuit board.

19. The system as claimed in claim 18, wherein said anti-mismounting portions are projections formed on brims of the corresponding cutouts, respectively.

20. The system as claimed in claim 19, wherein said connectors are received in the corresponding cutouts, respectively, under a condition that the respective distinguishable portions being recesses compliantly receive the corresponding anti-mismounting portions therein, and the anti-mismounting portion and the corresponding distinguishable portion are essentially protectively hidden in an interior side of the corresponding cutout.

* * * * *